US008797715B2

(12) United States Patent
Bromer

(10) Patent No.: US 8,797,715 B2
(45) Date of Patent: Aug. 5, 2014

(54) CAPACITOR WITH PARALLEL NANOTUBES

(75) Inventor: Nicholas S. Bromer, Marietta, PA (US)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 13/142,530

(22) PCT Filed: Mar. 23, 2011

(86) PCT No.: PCT/US2011/029640
§ 371 (c)(1),
(2), (4) Date: Jun. 28, 2011

(87) PCT Pub. No.: WO2012/128763
PCT Pub. Date: Sep. 27, 2012

(65) Prior Publication Data
US 2014/0016245 A1 Jan. 16, 2014

(51) Int. Cl.
*H01G 9/00* (2006.01)
(52) U.S. Cl.
USPC .......... 361/502; 361/503; 361/504; 361/512; 361/525; 361/528
(58) Field of Classification Search
USPC ......... 361/502, 503–504, 509–512, 516–519, 361/523–525, 528–529, 530
See application file for complete search history.

(56) References Cited

U.S. PATENT DOCUMENTS

| | | | | |
|---|---|---|---|---|
| 7,116,546 B2 * | 10/2006 | Chow et al. | | 361/508 |
| 7,295,503 B2 * | 11/2007 | Nickel | | 369/101 |
| 7,428,138 B2 * | 9/2008 | Mosley et al. | | 361/508 |
| 7,466,539 B2 * | 12/2008 | Dementiev et al. | | 361/502 |
| 7,553,341 B2 | 6/2009 | Pan et al. | | |
| 8,389,157 B2 * | 3/2013 | Frank et al. | | 429/209 |
| 8,599,533 B2 * | 12/2013 | Haight et al. | | 361/502 |
| 2008/0239620 A1 | 10/2008 | Min et al. | | |
| 2008/0280169 A1 | 11/2008 | Niu et al. | | |
| 2009/0168302 A1 | 7/2009 | Jiang et al. | | |
| 2010/0140591 A1 | 6/2010 | Nicholas et al. | | |
| 2010/0195263 A1 | 8/2010 | Sweeney et al. | | |

OTHER PUBLICATIONS

International Preliminary Report on Patentability issued Sep. 24, 2013.
Budnik et al., "A High Density, Carbon Nanotube Capacitor for Decoupling Applications," School of Electrical and Computer Engineering, Purdue University.
Zhang et al., "Electric-field-directed growth of aligned single-walled carbon nanotubes," in APL vol. 79, No. 19; Nov. 5, 2001.
Wood et al., "A Carbon Nanotube Capacitor Structure," in ISDRS 2007, Dec. 12-14, 2007, College Park, MD, USA.

(Continued)

Primary Examiner — Nguyen T Ha
(74) Attorney, Agent, or Firm — Turk IP Law, LLC

(57) ABSTRACT

Technologies are generally described for a capacitor device that includes parallel nanotubes. Such a capacitor device may include two parallel electrodes, each of which includes an array of nanotubes that extends from the surface of the respective electrode towards the other electrode. The nanotubes can be substantially parallel to each other and substantially perpendicular to the electrode from which they extend. The space between the electrodes and the nanotubes can be filled with an electrolyte or dielectric material, for example, a solution of an electrolyte solute in a suitable solvent. Such a capacitor device can have high electrode surface area but can avoid pore effects, in comparison to high surface area porous electrodes which do not have interpenetrating electrodes.

35 Claims, 12 Drawing Sheets

(56) References Cited

OTHER PUBLICATIONS

Maschmann et al., "Vertical single-and double-walled carbon nanotubes grown from modified porous anodic alumina templates", Nanotechnology, vol. 17, 3925-3929, 2006.

Signorelli, R. et al. "Electrochemical Double-Layer Capacitors Using Carbon Nanotube Electrode Structures." Proceedings of the IEEE 97.11 (2009): 1837-1847.

PCT/US11/29640 International Search Report and Written Opinion mailed Jun. 8, 2011.

"Graphene makes 'supercapacitor'," accessed at http://web.archive.org/web/20101128014846/http://physicsworld.com/cws/article/news/43828, Sep. 23, 2010, pp. 1-3.

Kosynkin et al., "Longitudinal unzipping of carbon nanotubes to form graphene nanoribbons," Letter in Nature, vol. 458, pp. 872-876 (2009).

Miller, J.R., and Simon, P., "Fundamentals of Electrochemical Capacitor Design and Operation," Supercapacitors, The Electrochemical Society Interface, Spring 2008, p. 1.

Namisnyk, A,M., "A Survey of Electrochmical Supercapacitor Technology," University of Technology, Sydney Faculty of Engineering, pp. 19 (Jun. 23, 2003).

Neergaard, L., "Scientists Urge Delay in Destroying Last Smallpox," accessed at http://www.biosciencetechnology.com/news/2014/05/scientists-urge-delay-destroying-last-smallpox, May 1, 2014, pp. 1-11.

Vieru, T., "Graphene Can Be Molded with Water," accessed at http://web.archive.org/web/20100117143536/http://news.softpedia.com/news/Graphene-Can-Be-Molded-with-Water-130028.shtml, Dec. 17, 2009, pp. 1-2.

\* cited by examiner

CAPACITOR WITH PARALLEL NANOTUBES

CROSS REFERENCE TO RELATED APPLICATIONS

This application claims the benefit of International Patent Application Serial No. PCT/US2011/029640 filed on Mar. 23, 2011. The disclosures of the International Patent Application are hereby incorporated by reference for all purposes.

BACKGROUND

Unless otherwise indicated herein, the materials described in this section are not prior art to the claims in this application and are not admitted to be prior art by inclusion in this section.

High surface area electrodes are commonly used in electrolytic supercapacitors and ultracapacitors. For example, activated charcoal is commonly used in electrochemical double layer supercapacitors (EDLCs). Also, a carbon nanotube "fur" has been described that has high surface area but is geometrically regular compared to porous carbon.

The present disclosure appreciates that there are several limitations with such strategies to high surface area capacitor electrodes. For example, in EDLCs using porous carbon, the stored charge conducts through the carbon surrounding a pore and through electrolyte at the pore, and charge stored near the pore is accessed through a short path with small electrolyte resistance. In contrast, charges deeper in the pore are accessed through a longer electrolyte path with significantly higher series resistance. This pore effect can increase charge/discharge time and decrease total capacitance.

In the above-mentioned "fur" example, the "fur" is typically coupled to one electrode and the adjacent nanotubes are at the same voltage. Therefore, the "fur" can also experience pore effects that limit the charge and discharge rates, and possibly also the amount of charge. In the "fur", parallel nanotubes create intermediate voids which resemble pores (deep and surrounded by carbon of a single polarity). Such interconnected voids do not overcome the pore effect, because the interconnection is lateral while the pore effect relates to depth (the length of the nanotubes). In the "fur" electrode, there can be a trade-off between such undesirable pore effects, which tend to increase as the spacing of the nanotubes decreases and length increases, and the desirable total charge, which tend to increase as the spacing of the nanotubes decreases and length increases, due to increased electrode area.

As is further appreciated in light of the present disclosure, overcoming pore effects while implementing high surface area electrodes for supercapacitors and ultracapacitors can be a complex undertaking.

SUMMARY

The following summary is illustrative only and is not intended to be in any way limiting. In addition to the illustrative aspects, embodiments, and features described above, further aspects, embodiments, and features will become apparent by reference to the drawings and the following detailed description.

The present disclosure generally describes capacitor devices employing nanotubes. An example capacitor device may include a first electrode and a second electrode. An example capacitor device may also include a first array of nanotubes conductively coupled to the first electrode, wherein the first array of nanotubes may be configured to extend from the first electrode towards the second electrode. An example capacitor device may also include a second array of nanotubes conductively coupled to the second electrode, wherein the second array of nanotubes may be configured to extend from the second electrode towards the first electrode.

The present disclosure also describes methods of forming the capacitor devices. In various examples, a method of forming a capacitor device with parallel nanotubes may include providing a first plate and a second plate, each plate having a plurality of vias coupling an inner surface and an outer surface of the respective plates. The method may also include providing a plurality of nanotube initiators at the inner surfaces of the first and second plates. The method may also include positioning the first plate in a substantially parallel orientation with respect to the second plate, wherein the inner surfaces of the first and second plates may be substantially opposite; and each nanotube initiator at the inner surface of the first plate may be substantially opposite to at least one of the plurality of vias in the second plate. Likewise, each nanotube initiator at the inner surface of the second plate may be substantially opposite to at least one of the plurality of vias in the first plate. The method may also include growing nanotubes from the nanotube initiators such that a portion of the nanotubes may extend from the inner surface of the first plate through the plurality of vias in the second plate, and another portion of the nanotubes may extend from the inner surface of the second plate through the plurality of vias in the first plate.

The present disclosure further describes a system for making the capacitor devices. In some examples, a system for forming a capacitor device with parallel nanotubes may include a plate manipulator, a nanotube growth chamber, and a controller coupled to the plate manipulator and the nanotube growth chamber. The controller may be configured to position a first plate and a second plate in a substantially parallel orientation with respect to each other, wherein inner surfaces of the first and second plates may be substantially opposite and each plate may include a plurality of vias coupling an inner surface and an outer surface of the respective plates. The controller may also be configured to grow nanotubes from nanotube initiators on the inner surfaces of the first and second plates such that a portion of nanotubes extend from the inner surface of the first plate through the plurality of vias in the second plate and another portion of the nanotubes extend from the inner surface of the second plate through the plurality of vias in the first plate.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 5B further illustrates the use of two end electrodes, which can be held at an opposite polarity from the nanotubes, to exert an attractive electrostatic force on at least a portion of the nanotubes as they grow;

Figure 1:
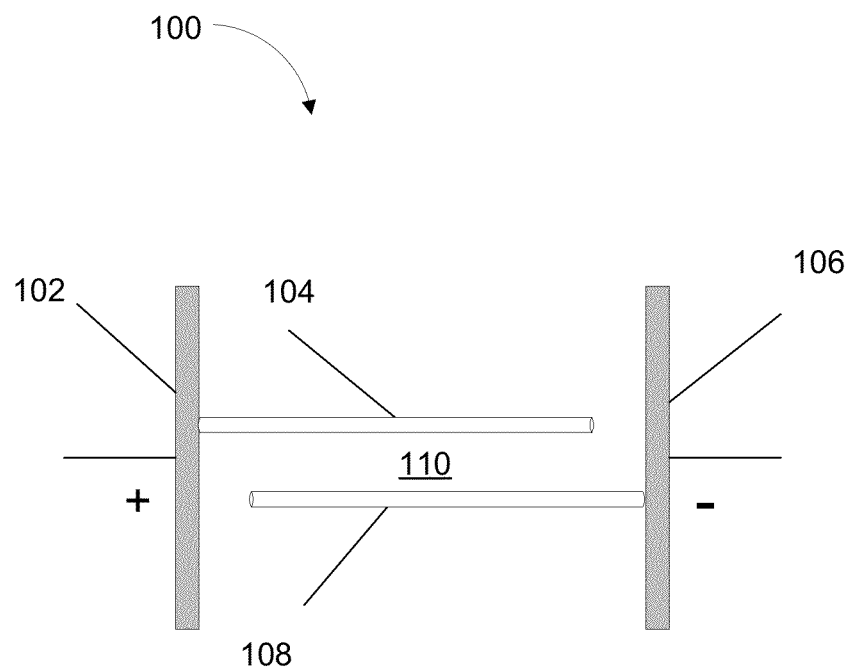
FIG. 1 illustrates an example cylindrical capacitor device in cross section along its axis, including a first nanotube conductively coupled to a first electrode, and a second nanotube conductively coupled to a second electrode.

all arranged in accordance with at least some embodiments as described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to compositions, methods, apparatus, systems, devices, and/or computer program products related to manufacturing or using arrays of nanotubes as electrodes, for example as part of an energy storage device such as a capacitor device.

Briefly stated, a capacitor device is generally described that includes parallel nanotubes. Such a capacitor device may include two parallel electrodes, each of which may include an array of nanotubes that extends from the surface of the respective electrode towards the other electrode. The nanotubes can be substantially parallel to each other and substantially perpendicular to the electrode from which they extend. The space between the electrodes and the nanotubes can be filled with an electrolyte or dielectric material, for example, a solution of an electrolyte solute in a suitable solvent. Such a capacitor device can have high electrode surface area but can avoid pore effects, in comparison to high surface area porous electrodes which do not have interpenetrating electrodes.

FIG. 1 illustrates an example cylindrical capacitor device in cross section along its axis, including a first nanotube conductively coupled to a first electrode, and a second nanotube conductively coupled to a second electrode, in accordance with at least some embodiments described herein. As illustrated in FIG. 1, a capacitor device 100, shown in cross section, can include a first nanotube 104 that can be conductively coupled to a first electrode 102. Likewise, capacitor device 100 also may include a second nanotube 108 that can be conductively coupled to a second electrode 106. First nanotube 102 can extend from first electrode 102 towards second electrode 106, while being isolated from second electrode 106 and second nanotube 108. Second nanotube 108 can extend from second electrode 106 towards first electrode 102, while being isolated from first electrode 106 and first nanotube 108. First electrode 102 and second electrode 106 can be configured to face each other in a parallel fashion. First nanotube 104 can be configured to be substantially parallel to second nanotube 108, first nanotube 104 can be configured to be substantially perpendicular to first electrode 102, and/or second nanotube 108 can be configured to be substantially perpendicular to electrode 106. There can be a gap 110, for example, extending between first nanotube 104 and first electrode 102. Gap 110 may also extend between second nanotube 108 and second electrode 106. Capacitor device 100 can be operated by holding electrodes 102 and 106 at opposite polarity, for example as indicated in FIG. 1 by the "+" and "−" signs. Holding electrodes 102 and 106 at opposite polarity also brings nanotubes 104 and 108 to opposing polarity. The increased surface area provided by nanotubes 104 and 108 can provide increased capacitance.

As used herein, the first and second arrays of nanotubes include nanotubes that have diameters in a range between about 1 nanometer and about 1 micrometer. The nanotubes employed herein are conductive or can have a conductive state. Suitable nanotubes may include one or more of metal or carbon. For example, suitable nanotubes include nanowires that employ one or more of silver, copper, gold, aluminum, tungsten, nickel, iron, vanadium, chromium, or titanium metal atoms. Suitable nanotubes may include carbon nanotubes, such as a multi-walled carbon nanotube (MWCNT) or a single-walled carbon nanotube (SWCNT). In various embodiments, the nanotubes are single walled carbon nanotubes. In various examples, carbon nanotubes may be suitable for capacitor devices described herein for any of the following reasons: (1) carbon nanotubes can be highly conductive of electricity, which can permit the nanotubes to be effective even when long compared to their diameters; (2) carbon nanotubes can be very small in diameter (on the order of 3-4 nanometers for some single walled carbon nanotubes), which can permit close packing and therefore large surface area and high charge density when included in the capacitor device examples described herein; (3) carbon nanotubes can be mechanically strong in tension, which can allow them to be stretched into parallel configurations while avoiding breakage; and/or (4) carbon nanotubes can be grown continuously.

Figure 2:
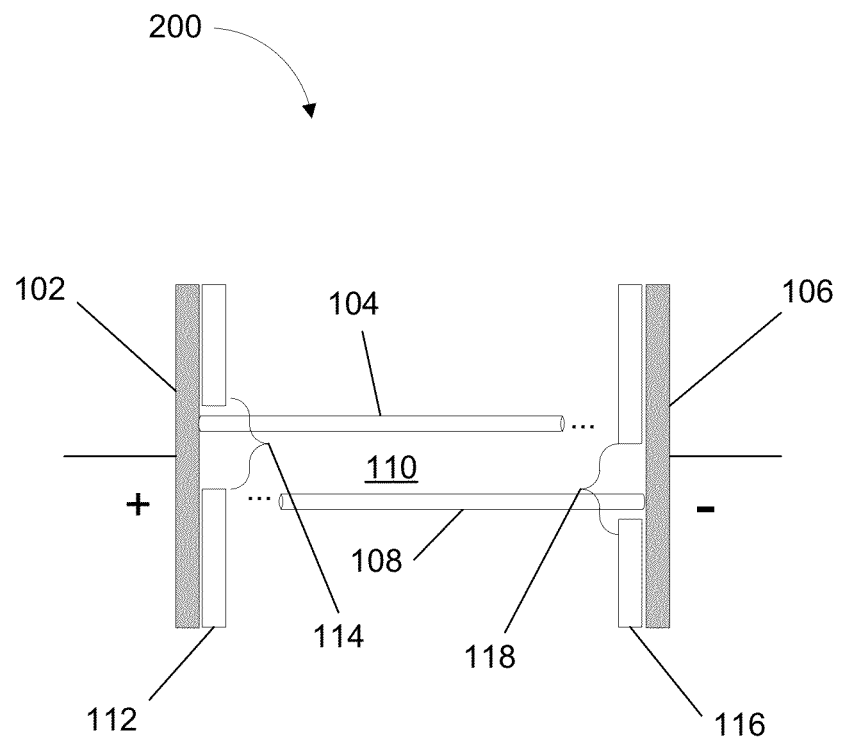
FIG. 2 illustrates an example cylindrical capacitor device as in FIG. 1 in cross section along its axis, additionally showing first and second semiconducting or insulating plates, each plate including a via.

FIG. 2 illustrates an example cylindrical capacitor device as in FIG. 1 in cross section along its axis, additionally showing first and second semiconducting or insulating plates, each plate including vias, in accordance with at least some embodiments described herein. Capacitor device 200 can include the features described above for capacitor device 100 in FIG. 1, with the following additions. Capacitor device 200 can include one or more of a first plate 112, a first electrode 102, a first nanotube 104, a second electrode 106 and/or a second nanotube 108. First plate 112 is configured to contact first electrode 102. First electrode 102 has one or more vias 114, where first nanotube 104 can be configured to extend from first electrode 102 through via 114 in first plate 112 toward second electrode 106. Second plate 116 is configured to contact second electrode 106. Second electrode 106 has one or more vias 118, where second nanotube 108 can be configured to extend from second electrode 106 through via 118 in second plate 116 toward first electrode 102. As indicated in FIG. 2 by the ellipsis at the end of each nanotube, first nanotube 104 may be configured to extend towards second plate 116, in some examples touching second plate 116, and in other examples not touching second plate 116. Similarly, second nanotube 108 may be configured to extend towards first plate 112, in some examples touching first plate 112, and in other examples not touching first plate 112. The additional space between the two nanotubes at the top of FIG. 3 is simply to permit clear placement of reference numerals 110, 114, and 118.

The first plate 112 and second plate 116 may be a semiconductor and/or an insulator, e.g., silicon, silicon dioxide, or any other semiconductor or insulator commonly used in semiconductor manufacturing. Such materials can be suitable not just for their insulating or semiconducting properties, but also because existing semiconductor manufacturing equipment and processes are available, well understood, and can be repurposed to easily manufacture items such as first and second plates 112/116, along with corresponding vias 114/119, and so on. Moreover, such materials and existing semiconductor manufacturing equipment and processes are also compatible with manufacture and handling of other features described herein, such as conductive layers, nanotube initiators, and the like.

Figure 3:
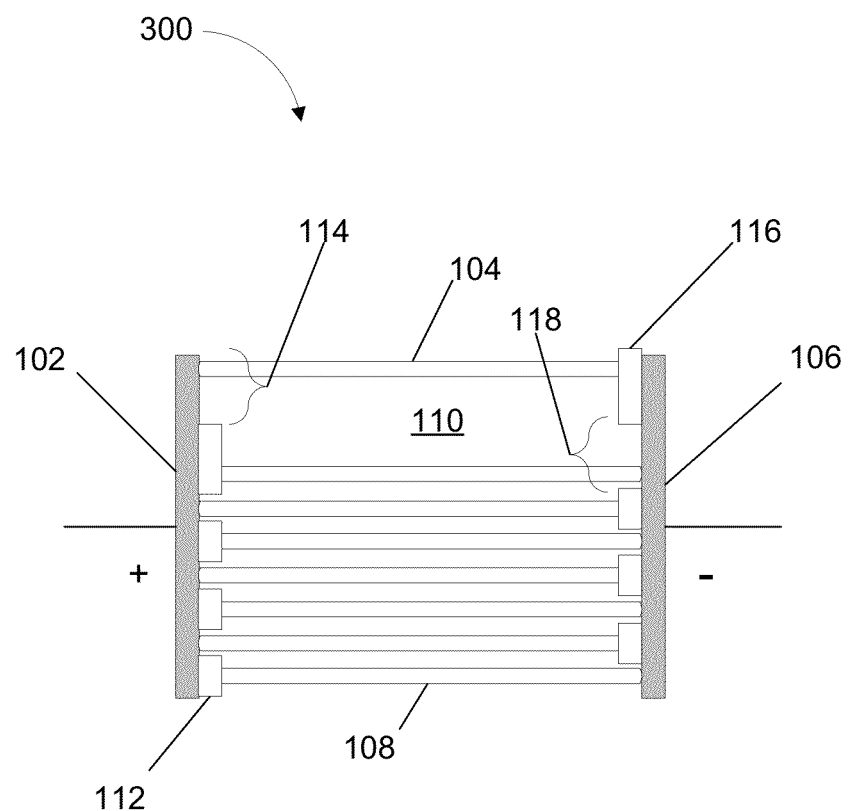
FIG. 3 illustrates an example cylindrical capacitor device in cross section along its axis, with a first nanotube array and a second nanotube array.

FIG. 3 illustrates an example cylindrical capacitor device in cross section along its axis with a first nanotube array and a second nanotube array, in accordance with at least some embodiments described herein. As illustrated in FIG. 3, capacitor device 300 can include the features described above for capacitor devices 100 and 200 in FIGS. 1 and 2, with the following additions. Capacitor device 300 may include an array of first nanotubes 104 and an array of second nanotubes 106. The array of first nanotubes 104 are configured to extend from first electrode 102 through a plurality of vias 114 in first plate 112, extending towards second electrode 106, and contacting second plate 116 through vias 118 in plate 116. Likewise, the array of second nanotubes 108 are configured to extend from second electrode 106 through a plurality of vias 118 in second plate 116, extending towards first electrode 102, and contacting first plate 112 through vias 114 in plate 112. The nanotubes in the array of first nanotubes 104 and the array of second nanotubes 106 can be equal, or approximately equal, either by number and/or in surface area, so that a corresponding capacitor device formed from such arrays is balanced. In some examples, the nanotubes can be spaced in a regular array.

Figure 4A:
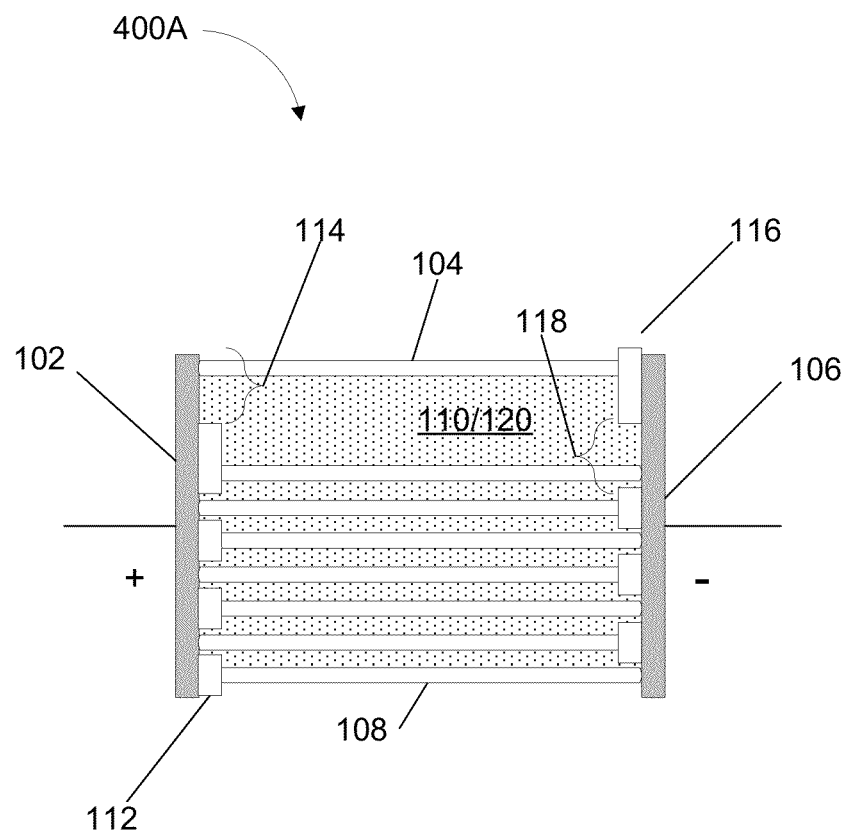
FIG. 4A illustrates the cylindrical capacitor device of FIG. 3 in cross section along its axis, further including an electrolyte in the gaps between the nanotubes.

FIG. 4A illustrates a capacitor device in cross section, further including an electrolyte in the gaps between the nanotubes, in accordance with at least some embodiments described herein. As illustrated in FIG. 4A, capacitor device 400A can include the features described above for capacitor devices 100, 200, and 300 in FIGS. 1, 2, and 3, with the following additions. Capacitor device 400A can include a dielectric or electrolyte material in gap 110 between nanotubes 104/108, electrodes 102/106, and plates 112/116. The additional space between the two nanotubes at the top of FIG. 4A is simply to permit clear placement of reference numerals 110/120, 114, and 118.

Although capacitors such as capacitor devices 100, 200, and 300 can operate with nothing but vacuum or air in gap 110, an example capacitor device may include a dielectric or electrolyte material such as material 120 occupying at least a portion of gap 110. Gap 110 can be occupied by a material 120 that is a polymer electrolyte, an electrolyte solute in a suitable solvent, or an ionic liquid that may function as both an electrolyte and a solvent. Suitable electrolytes may include those used for electrochemical double layer capacitors, for example, aqueous solutions of electrolyte salts such as alkali halides, alkali perchlorates, and organic electrolyte systems employed for electrochemical double layer capacitors. Organic systems tend to have higher breakdown voltages, in the range of about 2 volts to about 2.5 volts or so, but aqueous electrolytes may have higher conductivity and therefore may have faster charge/discharge rates, especially in capacitor devices with significant pore effects. In the capacitor device examples described herein, organic electrolytes, such as solutions of inorganic or organic salts in polar organic solvents, or organic ionic liquids, may be particularly effective since the high surface area and close proximity of the nanotube electrodes of the capacitor device examples described herein tends to reduce pore effects. Suitable organic electrolyte systems may include organic ionic liquids, and also may include inorganic salts such as alkali halides, alkali perchlorates, or organic salts such as tetraalkylammonium halides, in polar organic solvents such as acetonitrile, tetrahydrofuran, propylene carbonate, dimethylormamide, dimethyl sulfoxide, and the like.

The application of liquids and liquid electrolytes may tend to disrupt the nanotubes in their positioning because of surface tension forces. A similar problem has been observed, and solved, in the use and removal of solvent in the manufacture of aerogels. Aerogels can be made without disrupting delicate aerogel structures by starting with a solvent-infused gel, changing pressure and temperature to a region where the solvent(s) present are supercritical, and by definition have no surface tension, and removing the solvent(s) under such supercritical conditions. In the case of the present nanotube capacitor devices, solvents can be added without disruptive surface tension by placing the arrays of nanotubes at supercritical conditions for the solvent(s) to be added; adding the solvents; and/or returning the conditions of temperature, pressure, etc. from supercritical conditions to a desired temperature and pressure. Any desired electrolyte solutes can then be added by diffusion to the solvent between the nanotubes. Alternatively, the capacitor may be filled with liquid by maintaining one of the two plates 112 or 116 at a low temperature above the freezing point of the liquid, and allowing vapor at a higher temperature to enter the capacitor without surface tension and then condense onto the surface of a pool of cool liquid adjacent the chilled plate. After the capacitor is filled with liquid, electrolytic substances can be diffused into the liquid thereby condensed into the capacitor.

The spacing between adjacent nanotubes, particularly between those in the array of first nanotubes 104 and those in the array of second nanotubes 106, may be at least about the distance at which nanotubes of opposite polarity tend not to mechanically or electrically interfere with one another when they are charged through the plates. In various examples an electrolyte may be placed in gap 110. The nanotubes can be separated by a distance approximately equal to approximately twice a thickness of the portion of the electrolyte "double layer", which lies outside the surface of the nanotubes and may contain ions opposite to the charges of the nanotube.

Figure 4B:
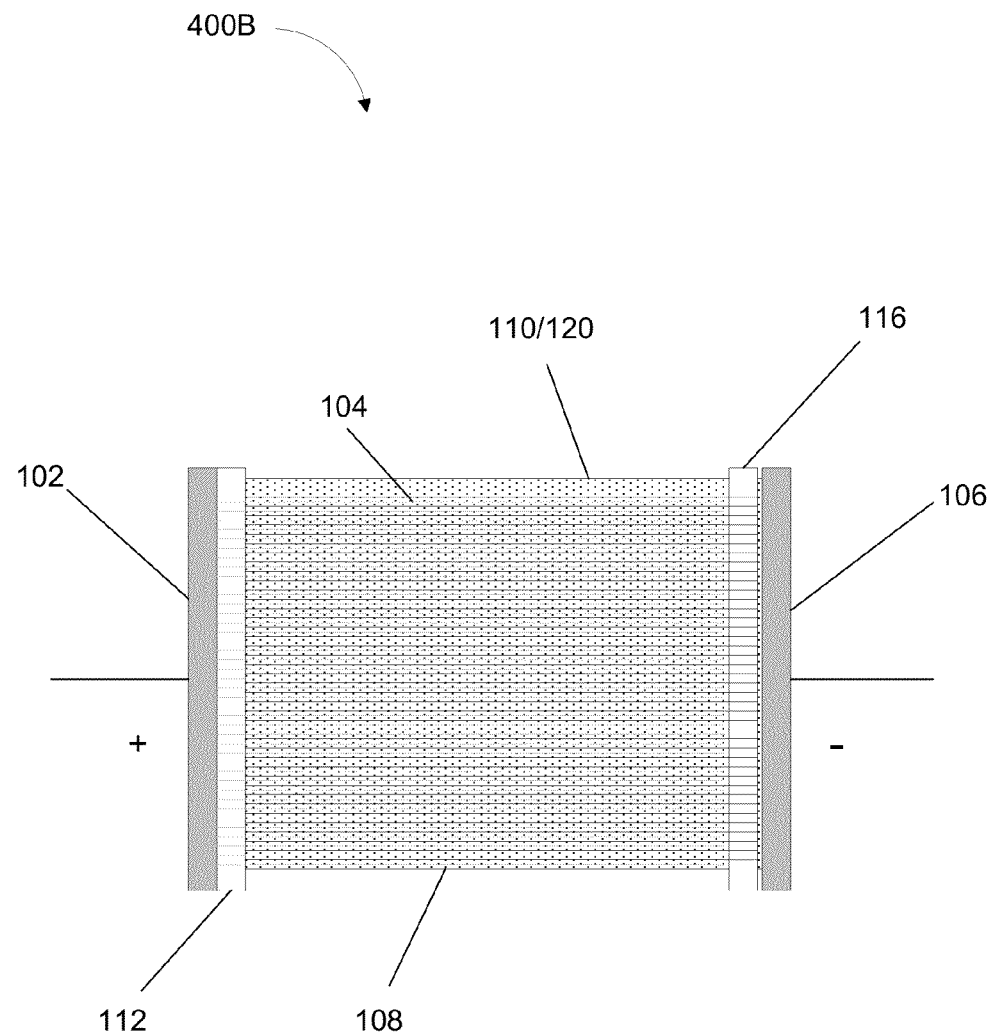
FIG. 4B illustrates a cylindrical capacitor device in cross section along its axis, showing that the density of nanotubes in the arrays of nanotubes in the capacitor device is high.
Figure 4C:
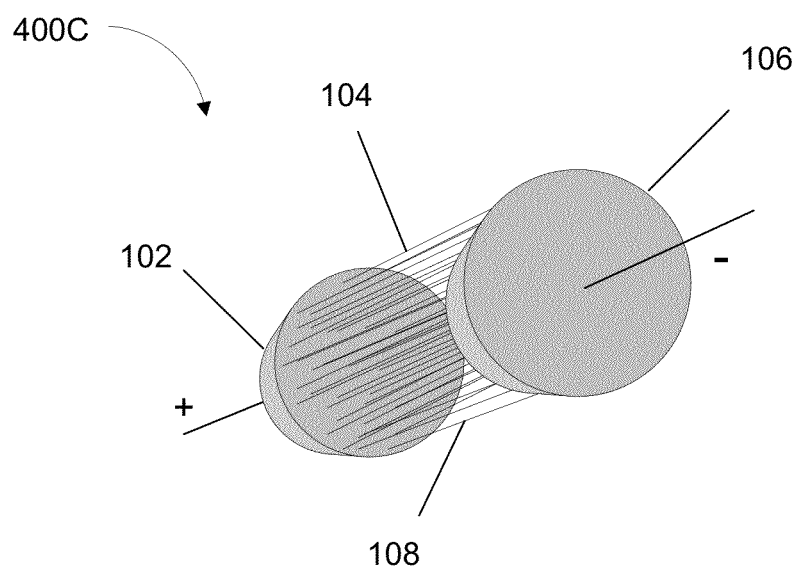
FIG. 4C is a perspective view down the axis of the cylindrical capacitor device in FIG. 4B.

FIG. 4B illustrates, in cross section, that the density of the nanotubes in the arrays of nanotubes in the capacitor device is high, in accordance with at least some embodiments described herein. FIG. 4C is a perspective view of the capacitor device in FIG. 4B, in accordance with at least some embodiments described herein. That is to say, FIGS. such as 1-4C are representative and intended to illustrate the various capacitor device examples, FIGS. 4B and 4C are particularly intended to illustrate examples where the density of nanotubes in first array of nanotubes 104 and second array of nanotubes 108 may be relatively high. FIG. 4B depicts a cross-sectional view of a capacitor device 400B, while FIG. 4C depicts a perspective view of capacitor device 400C, looking from second electrode 106 down the arrays of nanotubes 104/108 towards first electrode 102. For clarity of illustration, FIG. 4C omits first plate 112, second plate 116, and dielectric or electrolyte material 120. Likewise, for illustrative clarity, FIG. 4B does not expressly point out vias 114/118.

It is possible that nanotubes, particularly nanotubes held at opposite polarity, may tend to be attracted to each other, which could lead to shorting. In various examples, this phenomenon may be addressed by including the electrolyte. In electrochemical double layer capacitors, electrodes of a particular charge tend to be coated at their surfaces with oppositely charged ions in the electrolyte. The electrolyte tends to neutralize the charge at the surface of the nanotubes, which may avoid electrostatic attraction between nanotubes of opposite polarity. In other examples, a tendency towards shorting may be addressed by limiting an overall length of the nanotubes and/or the distance between the first and second electrodes. In further examples, a tendency towards shorting may be addressed by employing an axial hole in the first and second electrodes to inject a curable polymer, coating the polymer by spinning the capacitor on its longest axis, and curing the polymer using heat, UV radiation, or the like to form an insulating layer immobilizing the nanotubes at each end of the capacitor device. In yet other examples, a viscous electrolyte may be used or tension exerted on the nanotubes, e.g., by forcing the first and second plates apart by mechanical pressure or tension or by pressuring the electrolyte to push the two plates apart, and the like.

In some examples, a tendency towards shorting may also be addressed by grouping nanotubes of like polarity and separating such groups by a greater distance to reduce or avoid electrostatic attraction that may cause shorting between nanotubes of opposite polarity. This could occur if charge on the nanotubes is not canceled by opposing charges of the electrolyte on the nanotubes' surface, so that the net charge of any nanotube is non-zero and adjacent nanotubes of opposite polarity might attract each other and make electrical contact. Nanotubes of like polarity might similarly exert mutual electrostatic forces and tend to repel each other, but this is not a concern for shorting by separating opposing polarity groups by a somewhat larger spacing, any tendency of opposite polarity nanotubes to short can be reduced or avoided, as discussed in the following paragraphs about FIGS. 4D-4H.

Figure 4D:
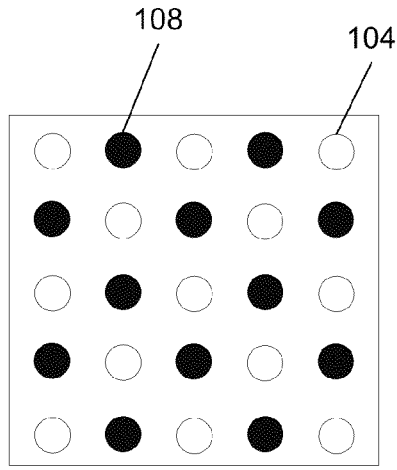
FIG. 4D illustrates an arrangement of a first array of nanotubes (white circles) and a second array of nanotubes (black circles) in cross section perpendicular to the nanotubes, where each nanotube in the first array of nanotubes is adjacent to at least one nanotube in the second array of nanotubes.

FIGS. 4D-4H are intended to illustrate various cross-sections of arrangements of nanotubes and groups of nanotubes, arranged in accordance with some embodiments described herein. For example, FIG. 4D illustrates an arrangement of a first array of nanotubes (white circles) and a second array of nanotubes (black circles) in cross section, where each nanotube in the first array of nanotubes is positioned adjacent to at least one nanotube in the second array of nanotubes. A first array of nanotubes 104 and a second array of nanotubes 108 are depicted in cross section where the nanotubes of both arrays together can be located, for example, on a square grid. The nearest neighbors of any particular nanotube may be the preceding or next nanotube along the same horizontal row or vertical column. Then, each nanotube of the first array of nanotubes 104 may be positioned adjacent to a nanotube from the second array of nanotubes 108; likewise, each nanotube of the second array of nanotubes 108 may be positioned adjacent to a nanotube from the first array of nanotubes 104. Here "adjacent" means nearest neighbor(s); on a square grid, nearest neighbors may include the preceding or next nanotube along the same horizontal row or vertical column. Similarly, nanotubes 104 and 108 may be placed at alternating (or non-alternating) vertices of polygons or other shapes which can tile a plane, such as equilateral triangles, hexagons, Penrose tiles, or other figures.

Figure 4E:
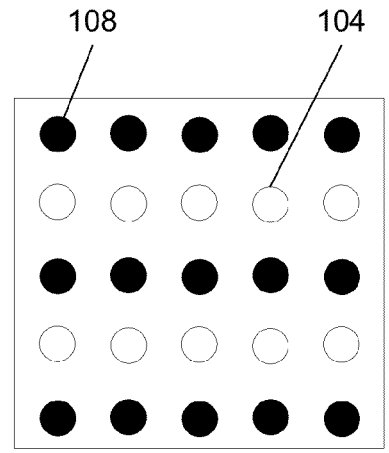
FIG. 4E illustrates an arrangement of first and second arrays of nanotubes in cross section perpendicular to the nanotubes where the respective nanotubes are arranged in row groupings.

FIG. 4E illustrates a cross-section of an arrangement of first and second arrays of nanotubes where the respective nanotubes are arranged in row groupings, in accordance with at least some embodiments described herein. As illustrated in FIG. 4E, each nanotube in the first array of nanotubes 104 may have two adjacent nanotubes, which are also of the first array of nanotubes 104, and two adjacent nanotubes, which are also of the second array of nanotubes 108. The nanotubes 104 may be grouped in rows that alternate with rows of nanotubes 108.

Figure 4F:
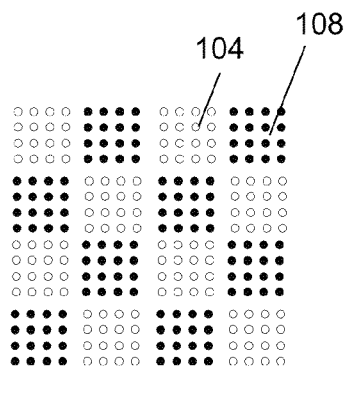
FIG. 4F illustrates an arrangement of first and second arrays of nanotubes in cross section perpendicular to the nanotubes where the respective nanotubes are arranged in square groupings.
Figure 4G:
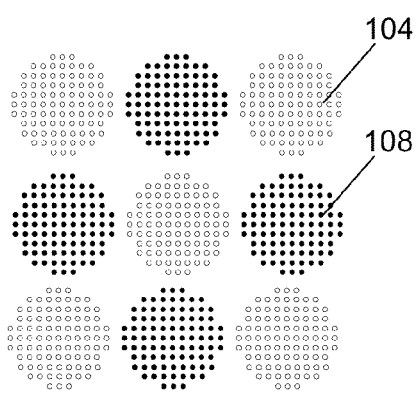
FIG. 4G illustrates an arrangement of first and second arrays of nanotubes in cross section perpendicular to the nanotubes where the respective nanotubes are arranged in circular groupings.
Figure 4H:
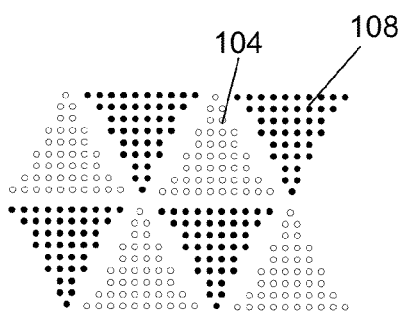
FIG. 4H illustrates an arrangement of first and second arrays of nanotubes in cross section perpendicular to the nanotubes where the respective nanotubes are arranged in triangular groupings.

FIG. 4F illustrates a cross-section of an arrangement of first and second arrays of nanotubes where the respective nanotubes are arranged in square groupings, in accordance with at least some embodiments described herein. FIG. 4G illustrates a cross-section of an arrangement of first and second arrays of nanotubes 104 and 108 where the respective nanotubes are arranged in circular groupings, in accordance with at least some embodiments described herein. FIG. 4H illustrates a cross-section of an arrangement of first and second arrays of nanotubes 104 and 108 where the respective nanotubes are arranged in triangular groupings, in accordance with at least some embodiments described herein. As illustrated in FIGS. 4E, 4F, 4G, and 4H, some nanotubes may be adjacent to nanotubes in the same array, and some nanotubes can be adjacent to nanotubes in the same or different array.

Figure 5A:
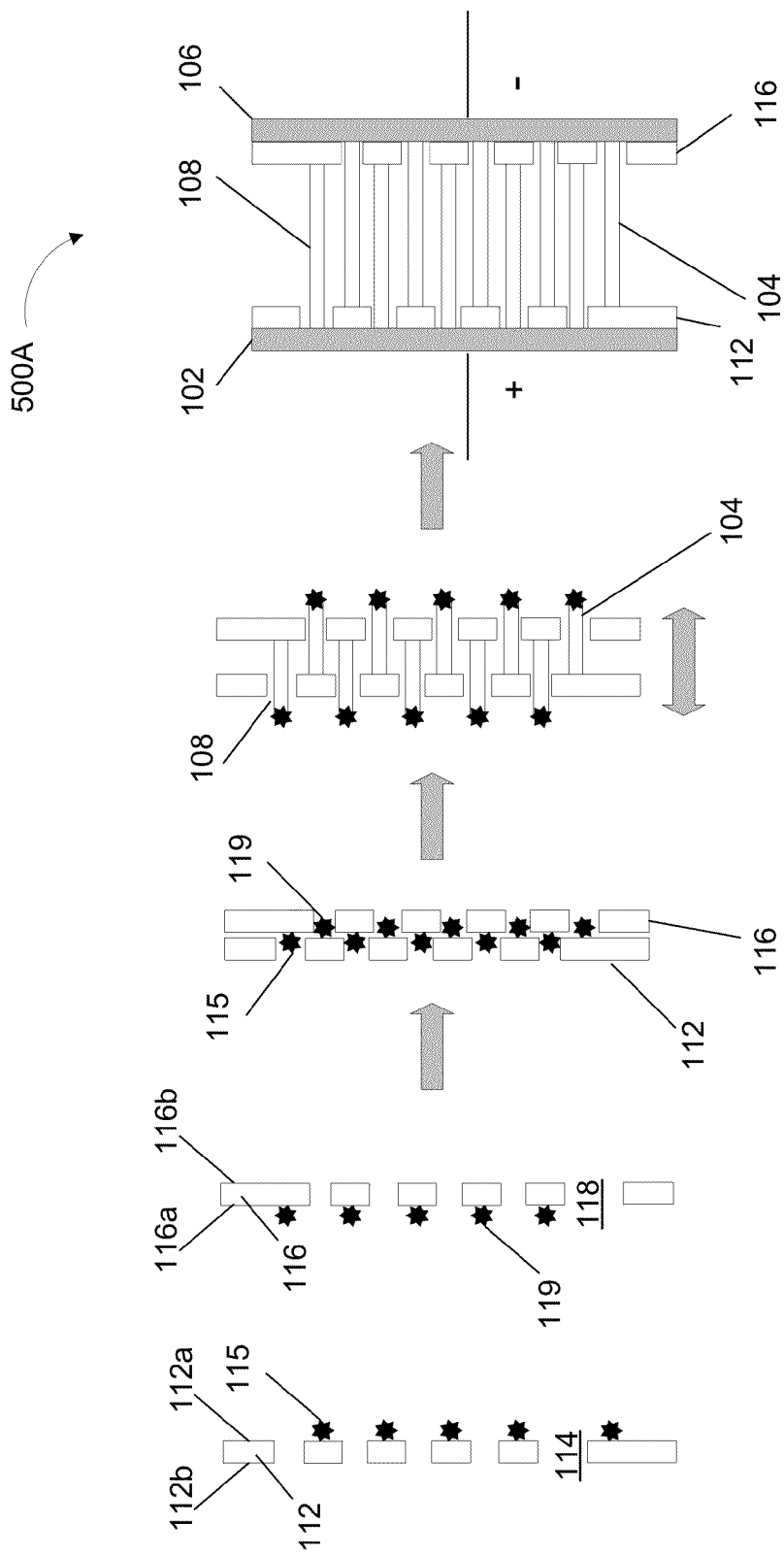
FIG. 5A illustrates steps in making a capacitor device, including providing first and second plates each having inner and outer surfaces, including vias and nanotube initiators; aligning the nanotube initiators and vias on opposing plates; and growing the nanotubes from the initiators the vias.

FIG. 5A illustrates steps in making a capacitor device, including providing first and second plates each having inner and outer surfaces, including vias and nanotube initiators; positioning the plates; and growing the nanotubes from the initiators through the vias, in accordance with at least some embodiments described herein.

As illustrated in FIG. 5A, a method for making a capacitor device according to some embodiments may include providing a first plate 112. The first plate 112 may include a plurality of vias 114 and nanotube initiators 115 located at an inner surface 112A between the vias 114. The inner surface 112A may be coupled by vias 114 to outer surface 112B. Likewise, a second plate 116 may include a plurality of vias 118 and nanotube initiators 119 located at an inner surface 116A of plate 116 between the vias 118. The inner surface 116A may be coupled by vias 114 to outer surface 116B.

The method may also include positioning first plate 112 and second plate 116 to face each other so that the nanotube initiators 115 at inner surface 112A of first plate 112 are configured substantially opposite to the vias 118 of second plate 116, and nanotube initiators 119 at inner surface 116A of second plate 116 are configured substantially opposite to vias 114 of first plate 112.

The method may also include growing the first array of nanotubes 104 from the nanotube initiators 115 and the second array of nanotubes 108 from the nanotube initiators 119 such that a portion of the nanotubes 104 are configured to extend from the inner surface 112A of the first plate 112 through the plurality of vias 118 in the second plate 116. Another portion of the nanotubes 108 may be configured to extend from the inner surface 116A of the second plate 116 through the plurality of vias in the first plate. As the nanotubes 104 and 108 grow, the method may also include separating plates 112 and 118, as indicated by the double-headed arrow in FIG. 5A. The plates 112 and 116 may be separated so that a portion of each nanotube is in at least one of the vias 114 and 118, which can help the nanotubes 104 and 108 to grow parallel to each other.

As used herein, "growing" the nanotubes means contacting suitable nanotube initiators with suitable growth reagents so that nanotubes are grown from the initiators, either extending from the nanotube initiator as a base, or growing from the tip of the nanotube, in effect keeping the nanotube initiator at the extending tip of the growing nanotube. In various examples, growth from the tip may be employed because the bases of the nanotubes can be crowded together on the plates and could be interfered with by nearby nanotubes creating a difficulty in immersing basal growth areas uniformly in the gases which serve as the growth medium for the nanotubes. On the other hand, with growth from the tips, uniform growth of all the nanotubes might be easier to achieve, because the nanotube ends are exposed. With exposed ends, the nanotubes' growth environment can be made more uniform and therefore uniformity of nanotube length might be easier to achieve.

Suitable nanotube initiators for carbon nanotubes may include, for example, seed particles of nickel, cobalt, or iron of the same size as the desired nanotube. Nanotube initiators may be applied using patterned (or masked) deposition of the metal (e.g., various semiconductor manufacturing techniques may be employed), annealing, or by plasma etching of a metal layer. Suitable growth conditions for carbon nanotubes from such initiators include various pressures and temperatures, as well as process and seed gases. For example, chemical vapor deposition (CVD) conditions may include atmospheric or reduced pressure; heating the substrate, e.g. from room temperature to about 900 degrees Celsius, in some examples between about 650 and about 750 degrees Celsius; injection of one or more process gases such as ammonia, nitrogen, or hydrogen; and injection of one or more carbon sources, such as methane, ethane, ethylene, acetylene, carbon monoxide, or the like. In some examples, the water vapor assisted carbon nanotube CVD method may be employed. In other examples, well-known carbon nanotube growth methods such as arc deposition or laser ablation may be employed.

The method as depicted in FIG. 5A may also include providing first electrode 102 at the outer surface 112B of first plate 112 and second electrode 106 at outer surface 116B of second plate 116, thus resulting in capacitor device 500A. This can also include conductively coupling first electrode 102 to the nanotubes in the second array of nanotubes 108, which are extending into the plurality of vias 114 in the first plate 112; and conductively coupling second electrode 106 to the nanotubes in the second array of nanotubes 104, which are extending into the plurality of vias 118 in the second plate 116. "Conductively coupling" the electrodes 102/106 to the nanotubes can include depositing a conductive material by one or more of sputtering, vapor deposition, evaporation of a solution or suspension, melt coating, conductive epoxy coating, conductive polymer coating, and/or electrochemical metal deposition. The method as depicted in FIG. 5A can further include applying mechanical tension to the nanotubes by separating the first and second plates 112/116 after conductively coupling the electrodes 102/106 to the nanotubes in the first and second arrays of nanotubes 104/108.

In some examples, the inner surface 112A of first plate 112 and the inner surface 116A of second plate 116 each can be conductive and electrically coupled to the corresponding nanotubes at that surface, but away from the vias 114 and 118, respectively. The method may then include applying the same potential to all the nanotubes, which, via electrostatic repulsion, may keep the nanotubes from touching each other as they grow in a substantially parallel position. In further examples, the outer surface 112B of first plate 112 and the outer surface 116B of second plate 116 each may be conductive, which may extend partly into the vias 114 and 118 to make electrical contact with the nanotubes 108 and 104, respectively. In these examples, the method may include charging the outer surfaces 112B and 116B to the same potential as the nanotubes extending through the corresponding vias, which, via electrostatic repulsion, may keep the nanotubes from touching as they grow.

Figure 5B:
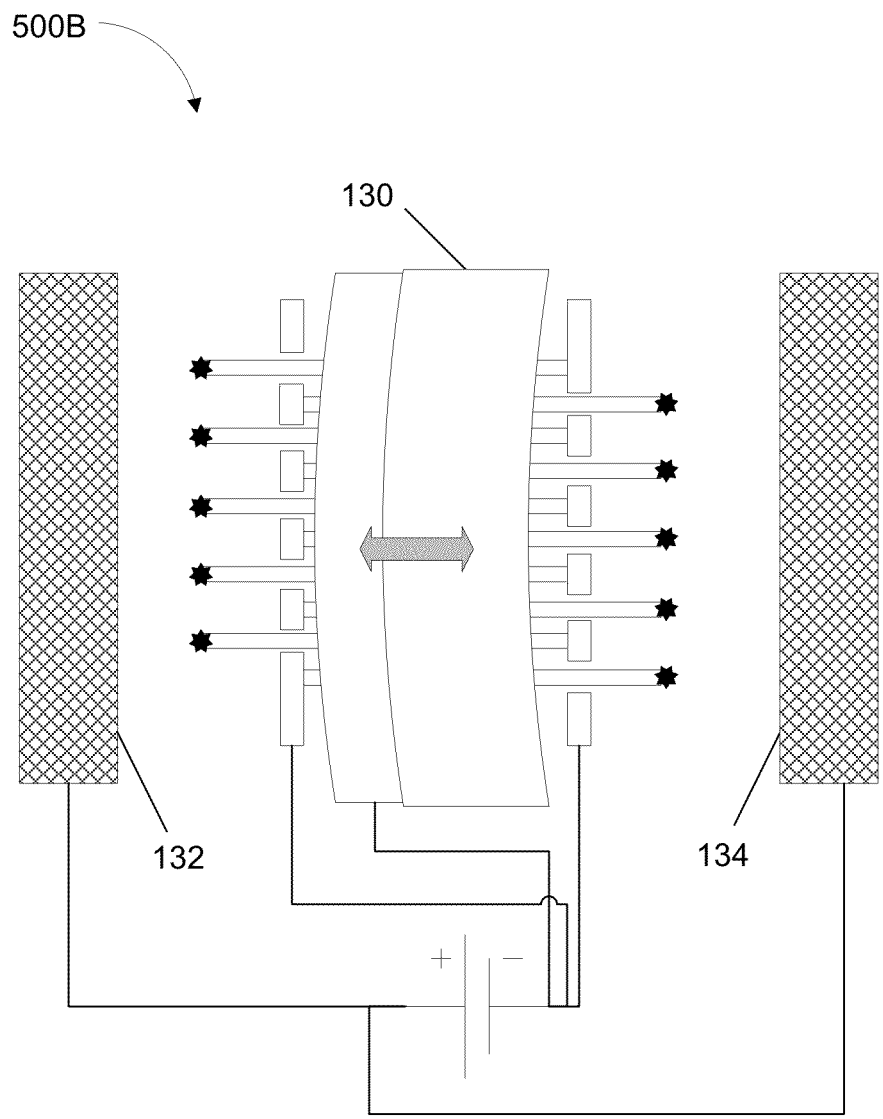
FIG. 5B is a conceptual drawing illustrating the use of a conductive sleeve, which can be held at the same polarity as the nanotubes to exert a repulsive electrostatic force on at least a portion of the nanotubes as they grow and as the plates are separated.

FIG. 5B illustrates the use of a conductive sleeve, which can be held at the same potential as the nanotubes to exert a repulsive electrostatic force on the nanotube as they grow and as the plates are separated, in accordance with at least some embodiments described herein. Capacitor device 500B, which may include all the features described above for capacitor device 500A in FIG. 5A, has additionally a conductive sleeve 130 substantially surrounding the nanotubes, for example by including cylindrical metallic portions as illustrated in FIG. 5B, and the first and second plates 112 and 116 may be substantially disc-shaped as shown in FIG. 4C. Conductive sleeve 130 may be charged to the same potential as the growing nanotubes, which may keep the nanotubes from bulging by creating a uniform electrical potential within the conductive sleeve 130 and thereby keep the nanotubes parallel as they grow. Conductive sleeve 130 may be extensible, for example by including telescoping portions as depicted, and may be extended as the nanotubes grow and as the first and second plates 112 and 116 are separated. Thereby, the effect of conductive sleeve 130 may be extended on the growing nanotubes. The conductive sleeve 130 can be fixed at the end of the manufacturing process, and can serve as the external casing of the capacitor device, which may be coated with an insulator, printed with identifying markings, and so on. Alternatively, the conductive sleeve may be removed for re-use and replaced with a housing of the finished capacitor, or an intermediate sleeve thereof.

FIG. 5B further illustrates the use of two end electrodes, which can be held at an opposite polarity from the nanotubes, for example, to create an electric field that can exert an electrostatic force on the nanotubes as they grow, in accordance with at least some embodiments described herein. End electrodes 132 and 134 may be mesh electrodes as illustrated or have comparable forms. Mesh electrodes can permit circulation of the deposition gas, so that the deposition gas may contact initiators 115 and 119 at the growing ends of the nanotubes 108 and 104. In one example, mesh electrodes 132 and 134 may be planar and disposed parallel to the adjacent electrodes 102 and 106, respectively, to form respective parallel-plate capacitors that can create a uniform electric field between electrodes 102 and 132, and 106 and 134, in which the lines of electric force are substantially parallel and perpendicular to mesh electrodes 132 and 134, and electrodes 102 and 106, except at the edges of the plates where "fringing" can occur. This example is but one possible arrangement that can create a uniform electric field in the nanotube-growth regions. Growing nanotubes tend to follow electric-field lines, so an electric field aligned with the direction of the nanotube portions between the two electrodes 132 and 134 may keep the nanotubes straight and aligned with the interior portions of the nanotubes. Other comparable electrode forms which permit circulation of the deposition gas across the faces of the plates 112 and 116, or which create an electric field aligned with the desired direction of the nanotubes may also be used. Also, to the extent that the nanotubes are charged, a potential may be applied to mesh electrodes 132 and 134 in opposite polarity to the potential of the corresponding nanotubes, to achieve the desired field. Mesh electrodes 132 and 134, and the conductive sleeve 130 can also be shaped to improve uniformity of the electric field and avoid "fringing" at the edges of electrodes 102 or 106 and mesh electrodes 132 or 134, for example by providing additional electrodes (not shown), by extending the area or diameter of the mesh electrodes 132 and 134 and/or the electrodes 102 and 106 to extend beyond the outer surface of the sleeve 130, or by other methods that may encourage the growth of the nanotubes through the vias and in the desired direction, and may encourage the nanotubes to grow parallel to each other. For example, the sleeve 130 can extend past plates 112 and 116 and surround the edges of the electrodes 102 and 106 to closely approach mesh electrodes 132 and 134, which could confine "fringing" to the region around the small gap between sleeve 130 and electrodes 102, 106, 132, and 134.

The specific battery polarity shown in FIG. 5B and other FIGS. is used for illustration, and the polarity can be reversed and adjusted as needed for best growth.

Figure 6:
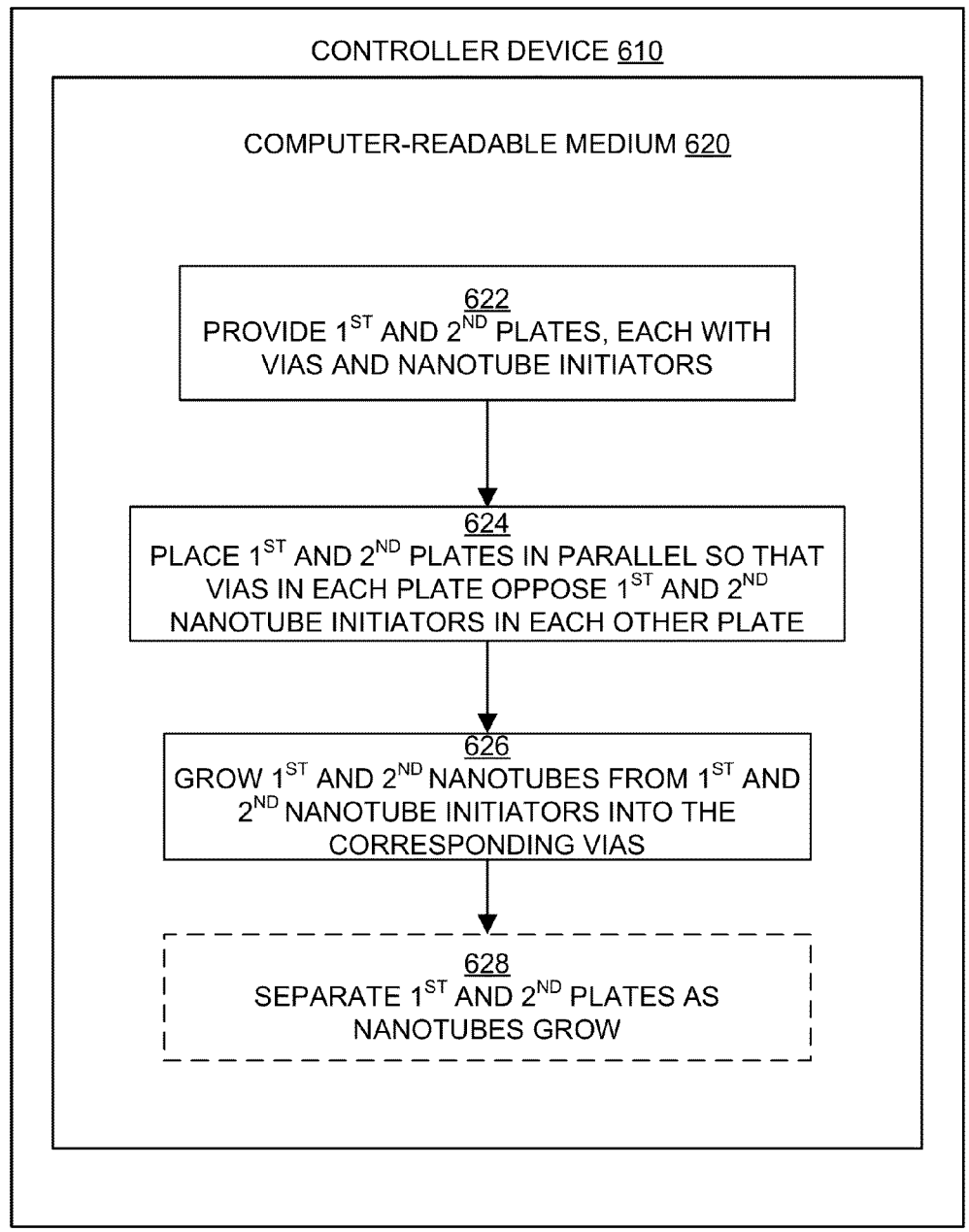
FIG. 6 is a flow diagram showing steps that may be used in making an example capacitor device as disclosed herein.

FIG. 6 is a flow diagram showing steps that may be used in forming an example capacitor device described herein, such as capacitor devices 200, 300, 400A, 400B, 500A, 500B, etc, in accordance with at least some embodiments described herein. In various examples, a method of forming a capacitor device with parallel nanotubes may include providing a first plate 112 and a second plate 116, each plate having a plurality of vias 114/118 configured to couple an inner surface 112A/116A and an outer surface 112B/116B of the respective plates 112/116. The method may also include providing a plurality of nanotube initiators 115/119 at the inner surfaces 112A/116A of the first and second plates 112 and 116. The method may further include positioning the first plate 112 in a substantially parallel orientation with respect to the second plate 116, where the inner surfaces 112A/116A of the first and second plates 112 and 116 can be positioned substantially opposite one another. Each nanotube initiator 115 at the inner surface 112A of the first plate 112 may be located substantially opposite to at least one of the plurality of vias 118 in the second plate 116, and each nanotube initiator 119 at the inner surface 116A of the second plate 116 may be located substantially opposite to at least at least one of the plurality of vias 114 in the first plate 112. The method may further include growing nanotubes 104/108 from the nanotube initiators 115/119 such that a portion of the nanotubes 108 extend from the inner surface 112A of the first plate 112 through the plurality of vias 118 in the second plate 116, and another portion of the nanotubes 104 extend from the inner surface 116A of the second plate 116 through the plurality of vias 114 in the first plate 112.

Figure 7:
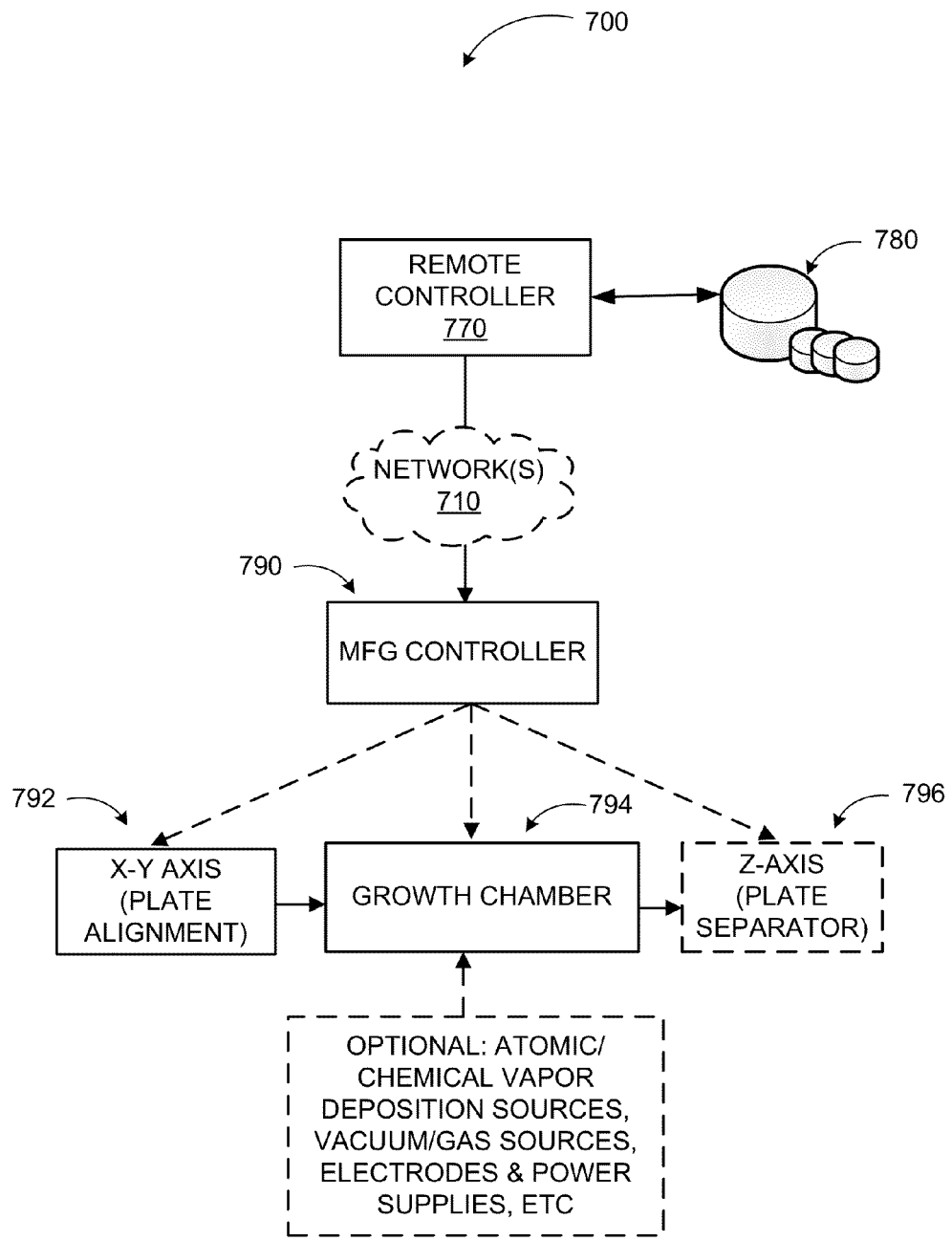
FIG. 7 is a block diagram of an automated machine that may be used for making an example capacitor device using the process steps outlined in FIG. 6.
Figure 8:
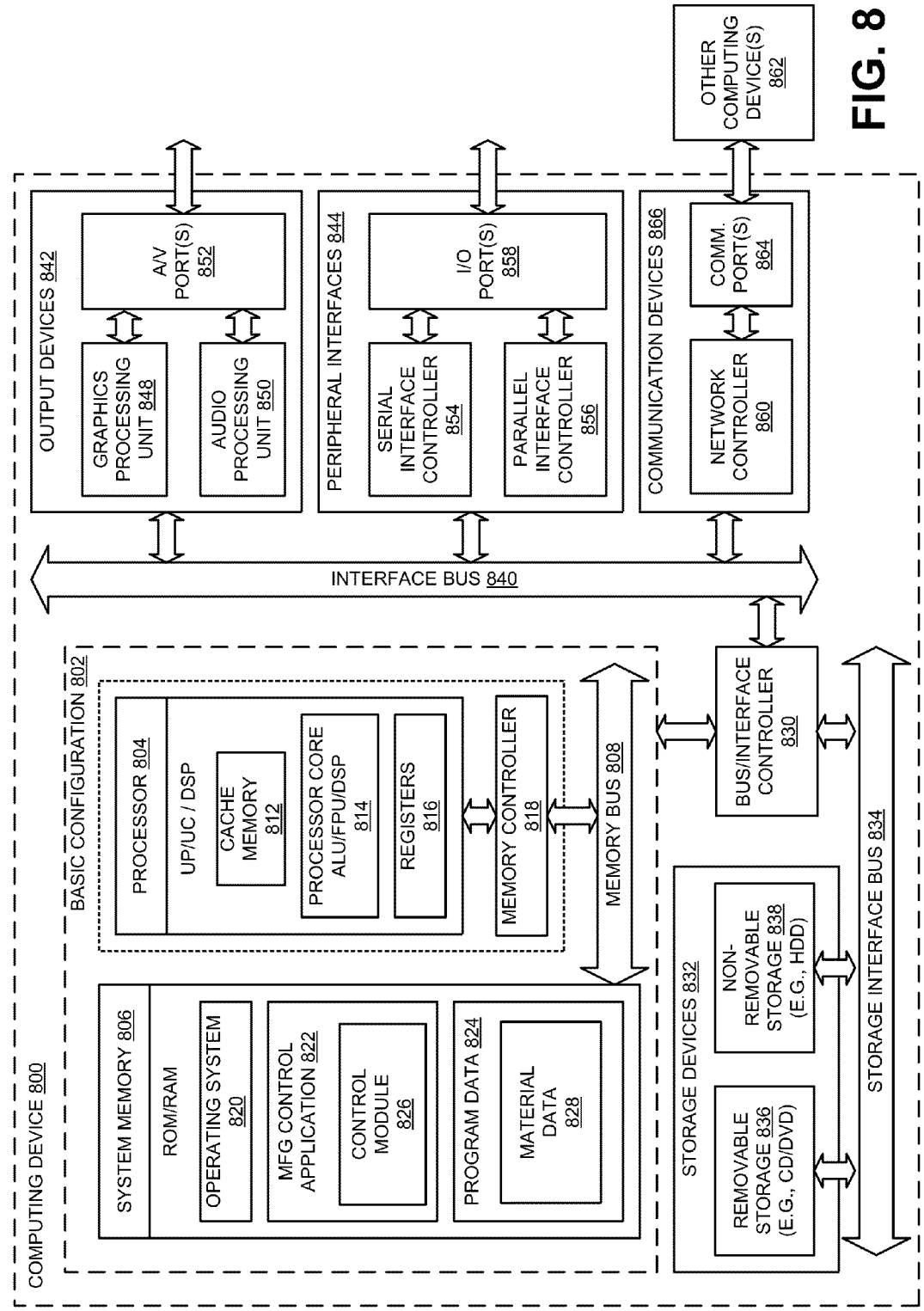
FIG. 8 illustrates a general purpose computing device that may be used to control the automated machine of FIG. 7 or similar manufacturing equipment in making an example capacitor device as disclosed herein.

In particular, FIG. 6 illustrates an example method of forming a capacitor device described herein that may be controlled by a computing device such as device 800 in FIG. 8 or a special purpose controller such as manufacturing controller 790 of FIG. 7. Thus, controller device 610 may be embodied as computing device 800, manufacturing controller 790, or similar devices executing instructions for controlling the performance of the method, stored in computer-readable medium 620, which may be non-transitory. A process of forming a capacitor device described herein may include one or more operations, functions or actions as is illustrated by one or more of blocks 622, 624, and/or 626.

Some example processes may begin with operation 622, "PROVIDE 1ST AND 2ND PLATES, EACH WITH VIAS AND NANOTUBE INITIATORS". Operation 622 may be performed, for example, by (manually or automatically) causing the first and second plates to be loaded into X-Y AXIS manipulator 792 of FIG. 7.

Operation 622 may be followed by operation 624, "PLACE 1ST AND 2ND PLATES IN PARALLEL SO THAT VIAS IN EACH PLATE OPPOSE 1ST AND 2ND NANOTUBE INITIATORS IN EACH OTHER PLATE". At operation 624, manufacturing controller 790 may be configured to instruct X-Y AXIS manipulator 792 with parameters (e.g., via one or more control signals) that facilitate operation 624, for example, alignment parameters of the plates, registration marks for alignment to be sensed by X-Y AXIS manipulator 792, and so on. At operation 624, the processor (e.g. processor 610) may be configured to control a coating or forming machine (e.g., via one or more control signals) such as coating/forming machine 794 of FIG. 7.

Operation 624 may be followed by operation 626, "GROW 1ST AND 2ND NANOTUBES FROM 1ST AND 2ND NANOTUBE INITIATORS INTO THE CORRESPONDING VIAS". At operation 626, the nanotubes may be grown by known methods corresponding to the nanotubes to be grown, e.g., atomic or chemical vapor deposition, and so on. Operation 626 may be followed by optional operation 628, "SEPARATE 1ST AND 2ND PLATES AS NANOTUBES GROW", where the plates may be separated mechanically, through an electrostatic force, or otherwise.

The operations included in the process of FIG. 6 described above are for illustration purposes. A process of forming an example capacitor device as described herein may be implemented by similar processes with fewer or additional operations. In some examples, the operations may be performed in a different order. In some other examples, various operations may be eliminated. In still other examples, various operations may be divided into additional operations, or combined together into fewer operations. Although illustrated as sequentially ordered operations, in some implementations the various operations may be performed in a different order, or in some cases various operations may be performed at substantially the same time.

FIG. 7 is a block diagram of an automated machine that may be used for making an example capacitor device using the process steps outlined in FIG. 6, in accordance with at least some embodiments described herein.

As illustrated in FIG. 7, a manufacturing controller 790 may be coupled to machines that can be used to carry out the steps described in FIG. 6, for example, an X—Y AXIS manipulator 792 (for plate alignment), a growth chamber 794 for growing the nanotubes, which may be equipped, for example, with atomic/chemical vapor deposition features, gas/vacuum inlets, electrodes for applying electric potentials to facilitate nanotube growth as described herein, and so on; and an optional Z-AXIS manipulator 796, for separating the first and second plates as the nanotubes grow. Note that when Z-AXIS manipulator 796 is included, it may be included in X-Y AXIS manipulator 792 as a 3-axis manipulator, or may be a separate machine. The X-Y AXIS manipulator 792 and the Z-AXIS manipulator 796 may be disposed inside or outside of the GROWTH CHAMBER (coating/forming machine) 794.

Manufacturing controller 790 may be operated by human control, or may be directed by a remote controller 770 via network 710. Data associated with controlling the different processes of forming a capacitor device may be stored at and/or received from data stores 780.

FIG. 8 illustrates a general purpose computing device that may be used to control the automated machine of FIG. 7 or similar manufacturing equipment in making an example capacitor device, in accordance with at least some embodiments described herein.

In a basic configuration 802, computing device 800 may include one or more processors 804 and a system memory 806. A memory bus 808 may be used for communicating between processor 804 and system memory 806.

Depending on the desired configuration, processor 804 may be of any type including but not limited to a microprocessor (µP), a microcontroller (µC), a digital signal processor (DSP), or any combination thereof. Processor 804 may include one more levels of caching, such as a level cache memory 812, a processor core 814, and registers 816. Example processor core 814 may include an arithmetic logic unit (ALU), a floating point unit (FPU), a digital signal processing core (DSP Core), or any combination thereof. An example memory controller 818 may also be used with processor 804, or in some implementations memory controller 815 may be an internal part of processor 804.

Depending on the desired configuration, system memory 806 may be of any type including but not limited to volatile memory (such as RAM), non-volatile memory (such as ROM, flash memory, etc.) or any combination thereof. System memory 806 may include an operating system 820, one or more manufacturing control applications 822, and program data 824. Manufacturing control application 822 may include a control module 826 that is arranged to control automated machine 700 of FIG. 7 and any other processes, methods and functions as discussed above. Program data 824 may include, among other data, material data 828 for controlling various aspects of the automated machine 700. This described basic configuration 802 is illustrated in FIG. 8 by those components within the inner dashed line.

Computing device 800 may have additional features or functionality, and additional interfaces to facilitate communications between basic configuration 802 and any required devices and interfaces. For example, a bus/interface controller 830 may be used to facilitate communications between basic configuration 802 and one or more data storage devices 832 via a storage interface bus 834. Data storage devices 832 may be removable storage devices 836, non-removable storage devices 838, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 806, removable storage devices 836 and non-removable storage devices 838 are examples of computer storage media. Computer storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 800. Any such computer storage media may be part of computing device 800.

Computing device 800 may also include an interface bus 840 for facilitating communication from various interface devices (e.g., output devices 842, peripheral interfaces 844, and communication devices 866 to basic configuration 802 via bus/interface controller 830. Example output devices 842 include a graphics processing unit 848 and an audio processing unit 850, which may be configured to communicate to various external devices such as a display or speakers via one or more A/V ports 852. Example peripheral interfaces 544 include a serial interface controller 854 or a parallel interface controller 856, which may be configured to communicate with external devices such as input devices (e.g., keyboard, mouse, pen, voice input device, touch input device, etc.) or other peripheral devices (e.g., printer, scanner, etc.) via one or more I/O ports 858. An example communication device 866 includes a network controller 860, which may be arranged to facilitate communications with one or more other computing devices 862 over a network communication link via one or more communication ports 864.

The network communication link may be one example of communication media. Communication media may be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 800 may be implemented as a portion of a physical server, virtual server, a computing cloud, or a hybrid device that include any of the above functions. Computing device 800 may also be implemented as a personal computer including both laptop computer and non-laptop computer configurations. Moreover computing device 800 may be implemented as a networked system or as part of a general purpose or specialized server.

Networks for a networked system including computing device 800 may comprise any topology of servers, clients, switches, routers, modems, Internet service providers, and any appropriate communication media (e.g., wired or wireless communications). A system according to embodiments may have a static or dynamic network topology. The networks may include a secure network such as an enterprise network (e.g., a LAN, WAN, or WLAN), an unsecure network such as a wireless open network (e.g., IEEE 802.11 wireless networks), or a world-wide network such (e.g., the Internet). The networks may also comprise a plurality of distinct networks that are adapted to operate together. Such networks are configured to provide communication between the nodes described herein. By way of example, and not limitation, these networks may include wireless media such as acoustic, RF, infrared and other wireless media. Furthermore, the networks may be portions of the same network or separate networks.

The present disclosure provides a capacitor device according to some embodiments. An example capacitor device may include a first electrode 102, and a second electrode 106. An example capacitor device may also include a first array of nanotubes 104 conductively coupled to the first electrode 102, where the first array of nanotubes 104 is configured to extend from the first electrode 102 towards the second electrode 106. An example capacitor device may further include a second array of nanotubes 108 conductively coupled to the second electrode 106, where the second array of nanotubes 108 is configured to extend from the second electrode 106 towards the first electrode 102.

In various examples, the capacitor device may include a first plate 112 that contacts the first electrode 102 and has one or more vias 114, where the first array of nanotubes 104 is configured to extend from the first electrode 102 through the one or more vias 114 in the first plate 102 towards the second electrode 106; and a second plate 116 that contacts the second electrode 106 and has one or more vias 118, where the second array of nanotubes 108 is configured to extend from the second electrode 106 through the one or more vias 118 in the second plate 116 towards the first electrode 102.

In various examples, the example capacitor device may also include a material 120 positioned in a gap 110 between the first and second arrays of nanotubes 104 and 108. In some examples of the capacitor device, material 120 may include one or more of a dielectric and/or an electrolyte. In some examples, material 120 can include a liquid electrolyte solution. The first and second plates 112 and 116 may include one or more of a semiconductor and/or an insulator. The first plate 112 can be configured in a substantially parallel orientation with respect to the second plate 116.

In other examples of the capacitor device, the first array of nanotubes 104 may be configured in a substantially perpendicular orientation with respect to the first plate 112; and the second array of nanotubes 108 may be configured in a substantially perpendicular orientation with respect to the second plate 116. The first array of nanotubes 104 may be configured in a substantially parallel orientation with respect to the second nanotube array 108.

In further examples of the capacitor device, the first array of nanotubes 104 may be configured to contact the second plate 116; and the second array of nanotubes 108 may be configured to contact the first plate 112. At least one nanotube in the first array of nanotubes 104 may be adjacent to at least one nanotube in the second array of nanotubes 108.

In yet other examples of the capacitor device, a group of nanotubes in the first array of nanotubes 104 may be adjacent to a group of nanotubes in the second array of nanotubes 108. In further examples, the groups of nanotubes in the first and second arrays of nanotubes 104 and 108 may each be configured in a pattern comprising one or more of a row, an ellipse, a triangle, a rectangle, a pentagon, and/or a hexagon. The first and second arrays of nanotubes 104 and 108 can include nanotubes that have diameters in a range between about 1 nanometer and about 1 micrometer.

Nanotubes in the first and second arrays of nanotubes 104 and 108 include one or more of metal or carbon. In other examples, nanotubes in the first and second arrays of nanotubes 104 and 108 can include one or more of silver, copper, gold, aluminum, tungsten, nickel, iron, vanadium, chromium, or titanium. In other examples, nanotubes in the first and second arrays of nanotubes 104 and 108 may be carbon nanotubes.

The present disclosure also provides a method of forming a capacitor device with parallel nanotubes. An example method may include providing a first plate 112 and a second plate 116, each plate having a plurality of vias 114/118 coupling an inner surface 112A/116A and an outer surface 112B/116B of the respective plates 112/116. Also included may be providing a plurality of nanotube initiators 115/119 at the inner surfaces 112A/116A of the first and second plates 112/116. Also included in the method may be positioning the first plate 112 in a substantially parallel orientation with respect to the second plate 116, where the inner surfaces 112A/116A of the first and second plates 112/116 may be substantially opposite; and each nanotube initiator 115/119 at the inner surface 112A of the first plate 112 may be substantially opposite to at least one of the plurality of vias 118 in the second plate 116, and each nanotube initiator 119 at the inner surface 116A of the second plate 116 may be substantially opposite to at least one of the plurality of vias 114 in the first plate 112. The example method may further include growing nanotubes from the nanotube initiators 115/119 such that a portion of the nanotubes may extend from the inner surface 112A of the first plate 112 through the plurality of vias 118 in the second plate 116, and another portion of the nanotubes may extend from the inner surface 116A of the second plate 116 through the plurality of vias 114 in the first plate 112.

In various examples, the method may include separating the first and second plates 112/116 as the nanotubes grow, where at least a portion of each nanotube is in one of the vias. The method may further include providing a first electrode 102 at the outer surface 112B of the first plate 112 and a second electrode 106 at the outer surface 116B of the second plate 116.

Further examples of the method may include applying an electric potential to the first and second electrodes 102/106 to provide an electric field substantially parallel to at least a portion of the growing nanotubes. A third electrode 132 positioned substantially opposite the outer surface 112B of the first plate 112 and a fourth electrode 134 positioned substantially opposite the outer surface 116B of the second plate 116 may be provided; and an electric potential may be applied to the third and fourth electrodes 132/134 to provide an electric field substantially parallel to at least a portion of the growing nanotubes.

Some examples of the method may include conductively coupling the first electrode 102 to the nanotubes 108 extending into the plurality of vias 114 in the first plate 112; and conductively coupling the second electrode 106 to the nanotubes 104 extending into the plurality of vias 118 in the second plate 116. Conductively coupling the electrodes 102/106 to the nanotubes 104/108 may include depositing a conductive material by one or more of sputtering, vapor deposition, evaporation of a solution or suspension, melt coating, conductive epoxy coating, conductive polymer coating, and/or electrochemical metal deposition.

Yet other examples of the method may include applying mechanical tension to the nanotubes 104/108 by separating the first and second plates 112/116 after conductively coupling the electrodes 102/106 to the nanotubes 104/108. In some case, one or more of an electrolyte and/or dielectric material 120 may be applied into a gap 110 between the nanotubes 104/108. Further examples of the method may include contacting the nanotubes 104/108 with an electrolyte solvent; and diffusing an electrolyte solute into the electrolyte solvent. In various examples, the electrolyte solvent may be supercritical.

Yet further examples of the method may include applying a first electrical potential to the nanotubes 104/108 and/or positioning a conducting sleeve 130 to surround a portion of the nanotubes 104/108 between the first and second plates 112/116. The method may further include applying a second electric potential with an opposite polarity to the first electric potential to the conducting sleeve 130. The first and second plates 112/116 may be separated as the nanotubes 104/108 grow; and the conducting sleeve 130 may be extended as the first and second plates 112/116 are separated.

The present disclosure further provides a system for forming a capacitor device with parallel nanotubes. An example system may include a plate manipulator, a nanotube growth chamber, and a controller coupled to the plate manipulator and the nanotube growth chamber. The controller may be configured to position a first plate 112 and a second plate 116 in a substantially parallel orientation with respect to each other, where inner surfaces 112A/116A of the first and second plates 112/116 may be substantially opposite and each plate may include a plurality of vias 114/118 coupling an inner surface 112A/116A and an outer surface 112B/116B of the respective plates 112/116. The controller may also be configured to grow nanotubes 104/108 from nanotube initiators 115/119 on the inner surfaces 112A/116A of the first and second plates 112/116 such that a portion of nanotubes extend from the inner surface 112A of the first plate 112 through the plurality of vias 118 in the second plate 116 and another portion of the nanotubes extend from the inner surface 116A of the second plate 116 through the plurality of vias 114 in the first plate 112.

In some examples of the system, the controller may direct the plate manipulator to separate the first and second plates 112/116 as the nanotubes grow, where at least a portion of each nanotube is in one of the vias 114/118.

In other examples, the system may further include an assembly device that is configured to affix a first electrode to the outer surface of the first plate and affix a second electrode to the outer surface of the second plate; and a power supply coupled to the controller and the first and second electrodes. The controller may be further configured to apply an electric potential using the power supply to the first and second electrodes to provide an electric field substantially parallel to at least a portion of the growing nanotubes.

In further examples, the assembly device may be further configured to position a third electrode coupled to the power supply substantially opposite the outer surface of the first plate; and position a fourth electrode coupled to the power supply substantially opposite the outer surface of the second plate. In such examples, the controller may be configured to apply an electric potential to the third and fourth electrodes to provide an electric field substantially parallel to at least a portion of the growing nanotubes.

The terms "a" and "an" as used herein mean "one or more" unless the singular is expressly specified. Thus, for example, reference to "a base" includes a mixture of two or more bases, as well as a single base.

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to, plus or minus 10% of the particular term.

The terms "optional" and "optionally" mean that the subsequently described circumstance may or may not occur, so that the description includes instances where the circumstance occurs and instances where it does not.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g. as one or more programs running on one or more microprocessors), as firmware, or as virtually any combination thereof, and that designing the circuitry and/or writing the code for the software and or firmware would be well within the skill of one of skill in the art in light of this disclosure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or components, which can, of course, vary. It is also to be understood that the terminology used herein is for the purpose of describing particular embodiments only, and is not intended to be limiting.

In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that an example data processing system may generally include one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

An example manufacturing system may be implemented utilizing any suitable commercially available components, such as those that may be found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A capacitor device, comprising:
    a first electrode;
    a second electrode;
    a first array of nanotubes conductively coupled to the first electrode, wherein the first array of nanotubes is configured to extend from the first electrode towards the second electrode;
    a second array of nanotubes conductively coupled to the second electrode, wherein the second array of nanotubes is configured to extend from the second electrode towards the first electrode; and
    a first plate that contacts the first electrode, the first plate having one or more vias, wherein the first array of nanotubes is configured to extend from the first electrode through the one or more vias in the first plate towards the second electrode.

2. The capacitor device of claim 1, further comprising a material positioned in a gap between the first and second arrays of nanotubes, wherein the material includes one or more of a dielectric and/or an electrolyte.

3. The capacitor device of claim 2, wherein the material includes a liquid electrolyte solution.

4. The capacitor device of claim 1, further comprising:
    a second plate that contacts the second electrode, the second plate having one or more vias, wherein the second array of nanotubes is configured to extend from the second electrode through the one or more vias in the second plate towards the first electrode.

5. The capacitor device of claim 4, wherein the first and second plates include one or more of a semiconductor and/or an insulator.

6. The capacitor device of claim 4, wherein the first plate is configured in a substantially parallel orientation with respect to the second plate.

7. The capacitor device of claim 4, wherein the first array of nanotubes is configured in a substantially perpendicular orientation with respect to the first plate; and the second array of nanotubes is configured in a substantially perpendicular orientation with respect to the second plate.

8. The capacitor device of claim 4, wherein the first array of nanotubes is configured in a substantially parallel orientation with respect to the second nanotube array.

9. The capacitor device of claim 4, wherein:
    the first array of nanotubes is configured to contact the second plate; and
    the second array of nanotubes is configured to contact the first plate.

10. The capacitor device of claim 1, wherein at least one nanotube in the first array of nanotubes is adjacent to at least one nanotube in the second array of nanotubes.

11. The capacitor device of claim 1, wherein a group of nanotubes in the first array of nanotubes is adjacent to a group of nanotubes in the second nanotube array.

12. The capacitor device of claim 11, wherein the groups of nanotubes in the first and second arrays of nanotubes are each configured in a pattern comprising one or more of a row, an ellipse, a triangle, a rectangle, a pentagon, and/or a hexagon.

13. The capacitor device of claim 1, wherein the first and second arrays of nanotubes include nanotubes that have diameters in a range between about 1 nanometer and about 1 micrometer.

14. The capacitor device of claim 1, wherein nanotubes in the first and second arrays of nanotubes include one or more of metal or carbon.

15. The capacitor device of claim 1, wherein nanotubes in the first and second arrays of nanotubes include one or more of silver, copper, gold, aluminum, tungsten, nickel, iron, vanadium, chromium, or titanium.

16. The capacitor device of claim 1, wherein nanotubes in the first and second arrays of nanotubes are carbon nanotubes.

17. A method of forming a capacitor device with parallel nanotubes, comprising:
    providing a first plate and a second plate, each plate having a plurality of vias coupling an inner surface and an outer surface of the respective plates;
    providing a plurality of nanotube initiators at the inner surfaces of the first and second plates;
    positioning the first plate in a substantially parallel orientation with respect to the second plate, wherein:
        the inner surfaces of the first and second plates are substantially opposite; and
        each nanotube initiator at the inner surface of the first plate is substantially opposite to at least one of the plurality of vias in the second plate, and each nanotube initiator at the inner surface of the second plate is substantially opposite to at least one of the plurality of vias in the first plate; and
    growing nanotubes from the nanotube initiators such that a portion of the nanotubes extend from the inner surface of the first plate through the plurality of vias in the second plate, and another portion of the nanotubes extend from the inner surface of the second plate through the plurality of vias in the first plate.

18. The method of claim 17, further comprising separating the first and second plates as the nanotubes grow.

19. The method of claim 18, further comprising providing a first electrode at the outer surface of the first plate and a second electrode at the outer surface of the second plate.

20. The method of claim 19, further comprising applying an electric potential to the first and second electrodes to provide an electric field substantially parallel to at least a portion of the growing nanotubes.

21. The method of claim 19, further comprising:
    providing a third electrode positioned substantially opposite the outer surface of the first plate and a fourth electrode positioned substantially opposite the outer surface of the second plate; and
    applying an electric potential to the third and fourth electrodes to provide an electric field substantially parallel to at least a portion of the growing nanotubes.

22. The method of claim 19, further comprising conductively coupling:
    the first electrode to the nanotubes extending into the plurality of vias in the first plate; and
    the second electrode to the nanotubes extending into the plurality of vias in the second plate.

23. The method of claim 22, wherein conductively coupling the electrodes to the nanotubes includes depositing a conductive material by one or more of sputtering, vapor deposition, evaporation of a solution or suspension, melt coating, conductive epoxy coating, conductive polymer coating, and/or electrochemical metal deposition.

24. The method of claim 23, further comprising applying mechanical tension to the nanotubes by separating the first and second plates after conductively coupling the electrodes to the nanotubes.

25. The method of claim 17, further comprising applying one or more of an electrolyte and/or dielectric material into a gap between the nanotubes.

26. The method of claim 17, further comprising:
contacting the nanotubes with an electrolyte solvent; and
diffusing an electrolyte solute into the electrolyte solvent.

27. The method of claim 26, further comprising substantially reducing surface tension forces of the electrolyte solvent on the nanotubes while contacting the nanotubes with the electrolyte solvent.

28. The method of claim 17, further comprising applying an electrical potential to the nanotubes.

29. The method of claim 28, further comprising:
positioning a conducting sleeve to surround a portion of the nanotubes between the first and second plates; and
applying the same electric potential with an opposite polarity to the conducting sleeve.

30. The method of claim 29, further comprising:
separating the first and second plates as the nanotubes grow; and
extending the conducting sleeve as the first and second plates are separated.

31. A system for forming a capacitor device with parallel nanotubes, comprising:
a plate manipulator;
a nanotube growth chamber; and
a controller coupled to the plate manipulator and the nanotube growth chamber, the controller configured to:
position a first plate and a second plate in a substantially parallel orientation with respect to each other, wherein inner surfaces of the first and second plates are substantially opposite and each plate includes a plurality of vias coupling an inner surface and an outer surface of the respective plates;
grow nanotubes from nanotube initiators on the inner surfaces of the first and second plates such that a portion of nanotubes extend from the inner surface of the first plate through the plurality of vias in the second plate and another portion of the nanotubes extend from the inner surface of the second plate through the plurality of vias in the first plate.

32. The system of claim 31, wherein the controller controls the plate manipulator to separate the first and second plates as the nanotubes grow, wherein at least a portion of each nanotube is in one of the vias.

33. The system of claim 31, further comprising:
an assembly device configured to:
affix a first electrode to the outer surface of the first plate;
affix a second electrode to the outer surface of the second plate; and
a power supply coupled to the controller and the first and second electrodes.

34. The system of claim 33, wherein the assembly device is further configured to:
position a third electrode coupled to the power supply substantially opposite the outer surface of the first plate; and
position a fourth electrode coupled to the power supply substantially opposite the outer surface of the second plate.

35. The system of claim 34, wherein the controller is configured to apply an electric potential to the third and fourth electrodes to provide an electric field substantially parallel to at least a portion of the growing nanotubes.

* * * * *

UNITED STATES PATENT AND TRADEMARK OFFICE
CERTIFICATE OF CORRECTION

| | | |
|---|---|---|
| PATENT NO. | : 8,797,715 B2 | Page 1 of 1 |
| APPLICATION NO. | : 13/142530 | |
| DATED | : August 5, 2014 | |
| INVENTOR(S) | : Bromer | |

It is certified that error appears in the above-identified patent and that said Letters Patent is hereby corrected as shown below:

In the Drawings

In Fig. 8, Sheet 12 of 12, delete "UP/UC / DSP" and insert -- $\mu P/\mu C/DSP$ --, therefor.

In the Specification

In Column 6, Line 48, delete "dimethylormamide," and insert -- dimethylformamide, --, therefor.

In Column 14, Line 21, delete "866" and insert -- 866) --, therefor.

Signed and Sealed this
Thirteenth Day of January, 2015

Michelle K. Lee
*Deputy Director of the United States Patent and Trademark Office*